(12) United States Patent
Doron et al.

(10) Patent No.: US 8,837,573 B2
(45) Date of Patent: Sep. 16, 2014

(54) APPARATUS AND METHOD THEREOF FOR COMPENSATING FOR GAIN CHANGES OF N-PAM MODULATE SIGNALS

(75) Inventors: Eran Doron, Herzliya (IL); Baruch Meborach Bublil, Netanya (IL); Yaron Slezak, Raanana (IL); Idan Versano, Holon (IL)

(73) Assignee: Transwitch Corporation, Shelton, CT (US)

(*) Notice: Subject to any disclaimer, the term of this patent is extended or adjusted under 35 U.S.C. 154(b) by 351 days.

(21) Appl. No.: 13/298,567

(22) Filed: Nov. 17, 2011

(65) Prior Publication Data
US 2013/0128943 A1     May 23, 2013

(51) Int. Cl.
*H03H 7/30* (2006.01)
*H03G 3/00* (2006.01)
*H04L 25/49* (2006.01)
*H04L 25/03* (2006.01)
*H04L 25/06* (2006.01)

(52) U.S. Cl.
CPC ...... *H03G 3/002* (2013.01); *H04L 2025/03363* (2013.01); *H04L 25/061* (2013.01); *H04L 25/4919* (2013.01)
USPC ........................... 375/236; 375/316; 375/346

(58) Field of Classification Search
CPC . H04L 5/4401; H04L 25/2647; H04L 25/067; H04L 25/4917; H04L 1/0045; H04L 27/06; H04L 27/38; H04L 27/066; H04L 7/033; H03K 7/02
USPC .................. 375/316, 320–321, 340, 353, 371
See application file for complete search history.

(56) References Cited

U.S. PATENT DOCUMENTS

2005/0058234 A1* 3/2005 Stojanovic ................... 375/371

\* cited by examiner

*Primary Examiner* — Sam K Ahn
*Assistant Examiner* — Janice Tieu
(74) *Attorney, Agent, or Firm* — Pearl Cohen Zedek Latzer Baratz LLP

(57) ABSTRACT

A method for compensating for gain changes of an N-level pulse amplitude modulation (PAM-N) modulated signal. The method comprises comparing the PAM-N modulated signal to N−1 configurable thresholds, wherein the input PAM-N modulated signal is also equalized and the N−1 configurable thresholds are N−1 different voltage levels; tracking gain changes in the input PAM-N modulated signal by comparing the input PAM-N modulated signal to a compensation threshold; and adjusting a level of the at least one of the N−1 configurable thresholds of the N−1 comparators based on an output of the compensation comparator, thereby offsetting a crossing point of the at least one comparator respective of the at least one of the N−1 configurable thresholds to compensate for gain changes in the input PAM-N modulated signal.

11 Claims, 5 Drawing Sheets

US 8,837,573 B2

APPARATUS AND METHOD THEREOF FOR COMPENSATING FOR GAIN CHANGES OF N-PAM MODULATE SIGNALS

TECHNICAL FIELD

This invention generally relates to a clock and data recovery of N-level pulse amplitude modulation (PAM-N) signals, and particularly for compensating for changes in the signals' gain to enable efficient clock and data recovery.

BACKGROUND OF THE INVENTION

During the process of data transmission, a transmitter continuously transmits signals to a receiver. The receiver uses a clock and data recovery (CDR) circuit to generate a clock corresponding to the incoming data stream, thereby correctly retiming the incoming data. Clock and data recovery (CDR) circuits may be based on a phase-locked loop (PLL) or an over-sampler. A PLL based CDR circuit generates a clock from an approximate frequency reference and uses the generated clock to phase-align to the transitions in the data stream with the PLL. The generated clock is a recovered clock transmitted by the transmitter.

Typically, the physical cable exhibits the characteristics of a low-pass filter. Therefore, the amplitude of the recovered data, received at the receiver, is attenuated and the phase is distorted. Also, the physical cable typically consists of wires which are not perfectly shielded. Thus, noise is present in the recovered data due to cross coupling between signals from different wires. In addition, external conditions, such as temperature changes, wear and tear of the cable, and so on may affect the amplitude of the receive signals.

Transmitted serial signals can be modulated using, for example, N level pulse amplitude modulation (PAM-N) technique, where N discrete voltage levels are used to encode input bits. The two common PAM techniques utilized to modulate high-speed serial signals are PAM-2 (also known as non-return-to-zero "NRZ") or PAM-4. In a PAM-2 two levels are used to encode a single bit. In a PAM-4, two bits are mapped to one of four possible differential voltage levels, for example, −3 volts, −1 volt, 1 volt, and 3 volts. Demodulation is performed by detecting the amplitude level of the carrier at every symbol period. The PAM-4 allows transmitting signals at double the rate of the PAM-2 signal, but the loss of PAM-4 modulated signals is higher than that of PAM-2 modulated signals. Experiments have shown that when the loss of the physical medium is more than 10 dB, the PAM-4 has been used in preference to PAM-2.

When transmitting PAM-4 modulated signals, the receiver should implement a clock and data recovery (CDR) circuit for recovering such signals. A PAM-4 CDR circuit typically detects the correct point to sample the incoming data stream. In a PAM-4 signal each 2-bit may include four transitions. An example for an implementation of a PAM-4 CDR circuit can be found in a U.S. patent application Ser. No. 13/157,526 titled "APPARATUS AND METHOD THEREOF FOR CLOCK AND DATA RECOVERY OF N-PAM ENCODED SIGNALS USING A CONVENTIONAL 2-PAM CDR CIRCUIT" (hereinafter "the '526 application"), assigned to the common assignee and hereby incorporated by reference.

The recovery of the signal, as discussed in the '526 application, is performed by comparing an input PAM-4 data signal to 3 configurable thresholds, each of which is set to a different voltage level, detecting major and minor transitions from one logic value to another logic value based on comparisons of the input data stream to the thresholds, and recovering the bits' values modulated in the input data when a minor transition has been detected. The outputs of the comparators, i.e., crossings of the thresholds, determine the PAM-4 levels of the input signal. Thus, the thresholds must be properly set to allow correct recovery of the signal.

The comparators' thresholds are set during power-up of the receiver typically to voltage levels around the common-mode (CM) voltage level of the circuit. However, PAM-4 voltage levels may be fluctuated due to changes in the environmental conditions in the cable and/or the CDR circuit. For example, as shown in FIG. 1, a cable 110 connects a transmitter 120 to a receiver 130. The transmitter 120 transmits PAM-4 modulated signals. The receiver 130 demodulates the received signals using a PAM-4 CDR circuit (not shown) included therein. This configuration may be found in any electronic device, such as a flat screen TV, a laptop computer, a DVD player, and the like.

Thus, for example, temperature changes in the electronic device may impact both the cable 110 and the receiver 130 and even the transmitter 120 (that may also include a PAM-4 CDR circuit). The temperature changes inside the device may cause variations in the attenuation level in the cable 110, the receiver 130, and even the transmitter 120. This would directly impact the transfer function of the cable 110, thus degrading the performance of the receiver 130 as data would not be properly recovered, i.e., there would be an increased number of a bit-error-rate.

It would be, therefore, advantageous to provide a solution to compensate for environmental conditions that create changes in the receiver, the transmitter, and/or cable, to enable correct clock and data recovery of PAM-N modulated signals.

SUMMARY OF THE INVENTION

Certain embodiments disclosed herein include an interface circuit for compensating for gain changes of an N-level pulse amplitude modulation (PAM-N) modulated signal. The interface circuit comprises a number of N−1 comparators for comparing the PAM-N modulated signal to N−1 configurable thresholds, wherein the input PAM-N modulated signal is also equalized and the N−1 configurable thresholds are N−1 different voltage levels; a compensation comparator for tracking gain changes in the input PAM-N modulated signal by comparing the input PAM-N modulated signal to a compensation threshold; and a compensation comparator for changing at least one of the N−1 configurable thresholds of the N−1 comparators based on an output of the compensation comparator, thereby offsetting a crossing point of at least one comparator respective of the at least one of the N−1 configurable thresholds to compensate for gain changes in the input PAM-N modulated signal.

Certain embodiments disclosed herein also include a method. The method for compensating for gain changes of an N-level pulse amplitude modulation (PAM-N) modulated signal, comprises comparing the PAM-N modulated signal to N−1 configurable thresholds, wherein the input PAM-N modulated signal is also equalized and the N−1 configurable thresholds are N−1 different voltage levels; tracking gain changes in the input PAM-N modulated signal by comparing the input PAM-N modulated signal to a compensation threshold; and adjusting a level of the at least one of the N−1 configurable thresholds of the N−1 comparators based on an output of the compensation comparator, thereby offsetting a crossing point of the at least one comparator respective of the at least one of the N−1 configurable thresholds to compensate for gain changes in the input PAM-N modulated signal.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE INVENTION

Figure 1:
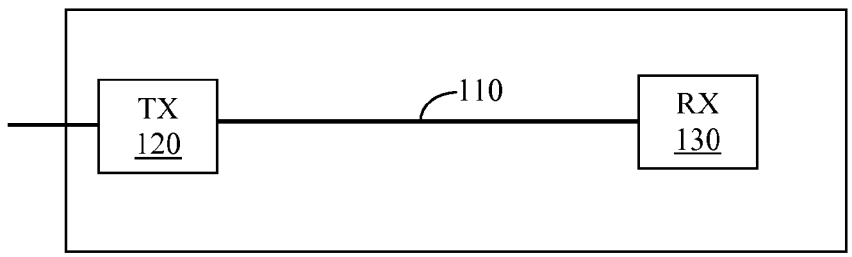
FIG. 1 is an exemplary connectivity between a receiver and a transmitter in an electronic device.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Figure 2:
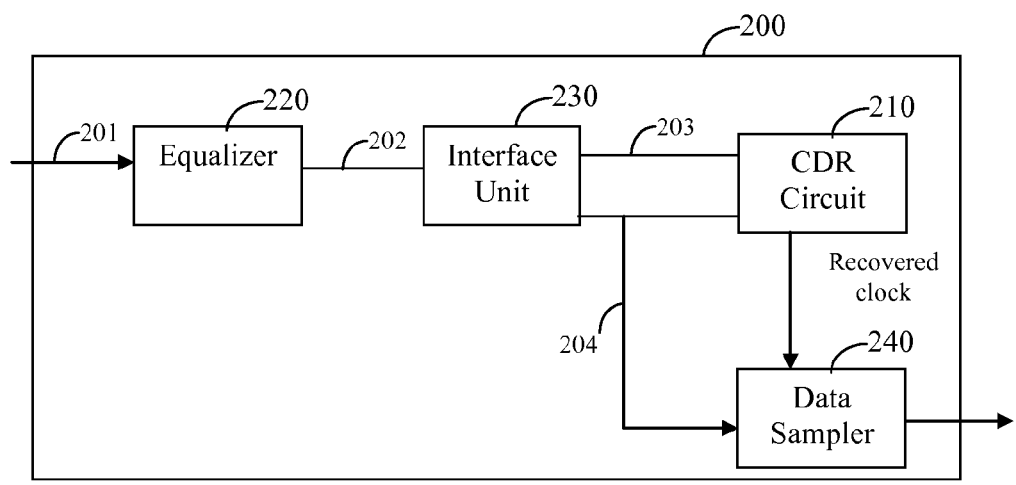
FIG. 2 is a block diagram of a receiver utilized to describe the various embodiments of the invention.

FIG. 2 shows an exemplary and non-limiting block diagram of a receiver 200 utilized to describe the various embodiments of the invention. The receiver 200 recovers data modulated in an input PAM-N signal, where N is equal to or greater than 4. The receiver 200 includes a PAM-N CDR circuit 210, an adaptive equalizer 220, and an interface unit 230 connected between the CDR circuit 210 and adaptive equalizer 220. The receiver 200 also includes a data sampler 240 that recovers the data signal using a recovered clock signal generated by the CDR circuit 210.

The receiver 200 is typically connected at one end of a serial multimedia interface and is capable of processing high-speed multimedia signals transmitted by a transmitter over the interface.

An input data stream 201 is equalized by the adaptive equalizer 220 to output an equalized data stream 202. The input data stream 201 is a high-speed serial data modulated using a PAM-N (N is a discrete number equal to or greater than 4) modulation technique. The equalizer 220 compensates for the cable losses depending upon the frequency. However, as mentioned above, the DC gain of the equalizer's 220 output may fluctuate due to, for example, temperature changes in the cable.

The interface unit 230 is designed to compensate for such environmental changes. Specifically, the interface unit 230 generates a data stream that can be correctly recovered by the CDR circuit 210. In one embodiment, the CDR circuit 210 phase aligns to the transitions in the input data stream 201 according to a transition signal 203 generated by the interface unit 230.

The interface unit 230 also outputs, to the data sampler 240, a bit-data stream 204 that includes the values of the bits encoded in the PAN-N input signal. For example, if the receiver 200 is a PAM-4 receiver, the bit-data stream 204 includes the 2 bits encoded in an input PAM-4 signal 201. The interface unit 230 is described in greater detail below with reference to FIG. 3.

The data sampler 240 samples the bit-data stream 204 using the recovered clock signal, provided by the CDR circuit 210, to produce a recovered bit-data. In one embodiment, the data sampler 240 converts each bit of a sampled bit-data stream to 'k' parallel bits (k is an integer number greater than 1). For example, in a PAM-4 implementation, the data sampler 240 outputs 2*k parallel bits of the recovered signal.

Figure 3:
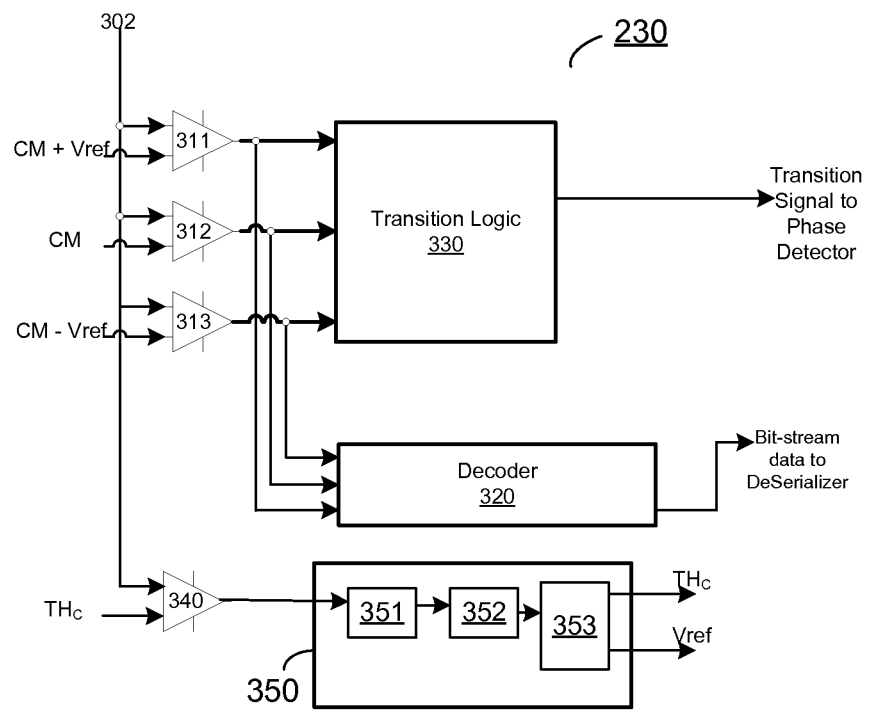
FIG. 3 is a block diagram of the interface unit in accordance with an embodiment of the invention.

FIG. 3 shows an exemplary and non-limiting block diagram of the interface unit 230 implemented in accordance with an embodiment of the invention. For the sake of brevity and without limiting the scope of the invention, the interface unit 230 will be described with a reference to a particular embodiment where the receiver is a PAM-4 receiver, thus the interface is capable of processing a PAM-4 signal. However, it should be noted that one of ordinary skill can adapt the teachings of the PAM-4 interface to implement a higher level PAM interfaces and receivers.

The interface unit 230 includes 3 comparators 311, 312, and 313; each compares the equalized input PAM-4 signal 302 to its respective threshold. The comparator 311 is set to the common-mode (CM) voltage level plus a reference voltage level (Vref); the comparator 312 is set to the CM voltage level; and the comparator 313 is set to the CM voltage level minus the Vref.

In an embodiment, the Vrefs are adjusted, as will be discussed below, to offset any changes in the DC-gain of the equalized signal 302 that results from, for example, temperature changes in the cable and/or receiver. Thus, by changing the threshold levels, the crossing points of the comparators 311 and 313 are adjusted to enable proper detection of the new voltage levels of the signal 302.

The decoder 320 maps the comparison results of the comparators 311, 312, and 313 into two bits to be connected to DeSerializer (not shown). Table 1 shows an example for the mapping performed by the decoder 320.

TABLE 1

| 4-PAM levels | Comparator 311 | Comparator 312 | Comparator 213 | Decoder's 320 Output |
|---|---|---|---|---|
| +3V | 1 | 1 | 1 | 00 |
| +1V | 0 | 1 | 1 | 01 |
| −1V | 0 | 0 | 1 | 10 |
| −3V | 0 | 0 | 0 | 11 |

The interface unit 230 may also include a transition logic 330 that generates a transition signal upon detection of a major transition in the input signal to be connected to Phase-Detector (not shown). The transition logic 330 is described in greater detail in the '526 application.

In accordance with certain embodiments disclosed herein, the interface unit 230 includes a compensation comparator 340 and circuit 350 utilized to set the threshold levels of the comparators 311 and 313 in order to adjust for any gain changes in the equalized signal 302. Specifically, the compensation comparator 340 and circuit 350 continuously tracks changes in the voltage level of the equalized signal 302 and sets the Vref of the comparators 311 and 313 to a new value, thereby setting the crossing points of these comparators in order to properly recover the two encoded bits.

The compensation comparator 340 receives two inputs signals, a compensation threshold ($TH_C$) and the equalized signal 302. The comparator 340 outputs a high logic value '1' upon crossing of the $TH_C$, and a low logic value '0', otherwise. The compensation comparator circuit 350 includes an accumulator 351 that accumulates the number of crossings and 'non-crossings' over time, i.e., the number of '1' and '0' values output by the comparator 340. The circuit 350 also includes a controller 352 and a voltage setting unit 353 that sets the $TH_C$ and Vref based on the control signal generated by the controller 352. The controller 352 determines to which voltage level to set the $TH_C$ and Vref using at least one of the compensation processes described below.

The dynamic range of the compensation comparator 340 is from 0 v to +4 v or between 0 v to −4 v as the polarity of the comparator 340 may be programmable. Table 2 provides an example for the outputs of the comparators 311, 312, 313, and 340 with respect to the voltage levels of a PAM-4 modulated signal.

TABLE 2

| PAM-4 levels | S[i] | Comparator 340 | Comparator 340 | Comparator 311 | Comparator 312 | Comparator 313 |
|---|---|---|---|---|---|---|
| | | Threshold levels | | | | |
| | | +3 | +1 | +2 | 0 | −2 |
| +3 | i = 0 | 50% = 1 50% = 0 | 100% = 1 | 1 | 1 | 1 |
| +1 | i = 1 | 100% = 0 | 50% = 1 50% = 0 | 0 | 1 | 1 |
| −1 | i = 2 | 100% = 0 | 100% = 0 | 0 | 0 | 1 |
| −3 | i = 3 | 100% = 0 | 100% = 0 | 0 | 0 | 0 |

In the exemplary Table 2, the $TH_C$ is set to +3 v, thus optimally when the PAM-4 level is +3 v, 50% of the comparator's 340 readings will indicate "crossings" (e.g., '1' value) and 50% will indicate "non-crossings" (e.g., '0' value).

Figure 4:
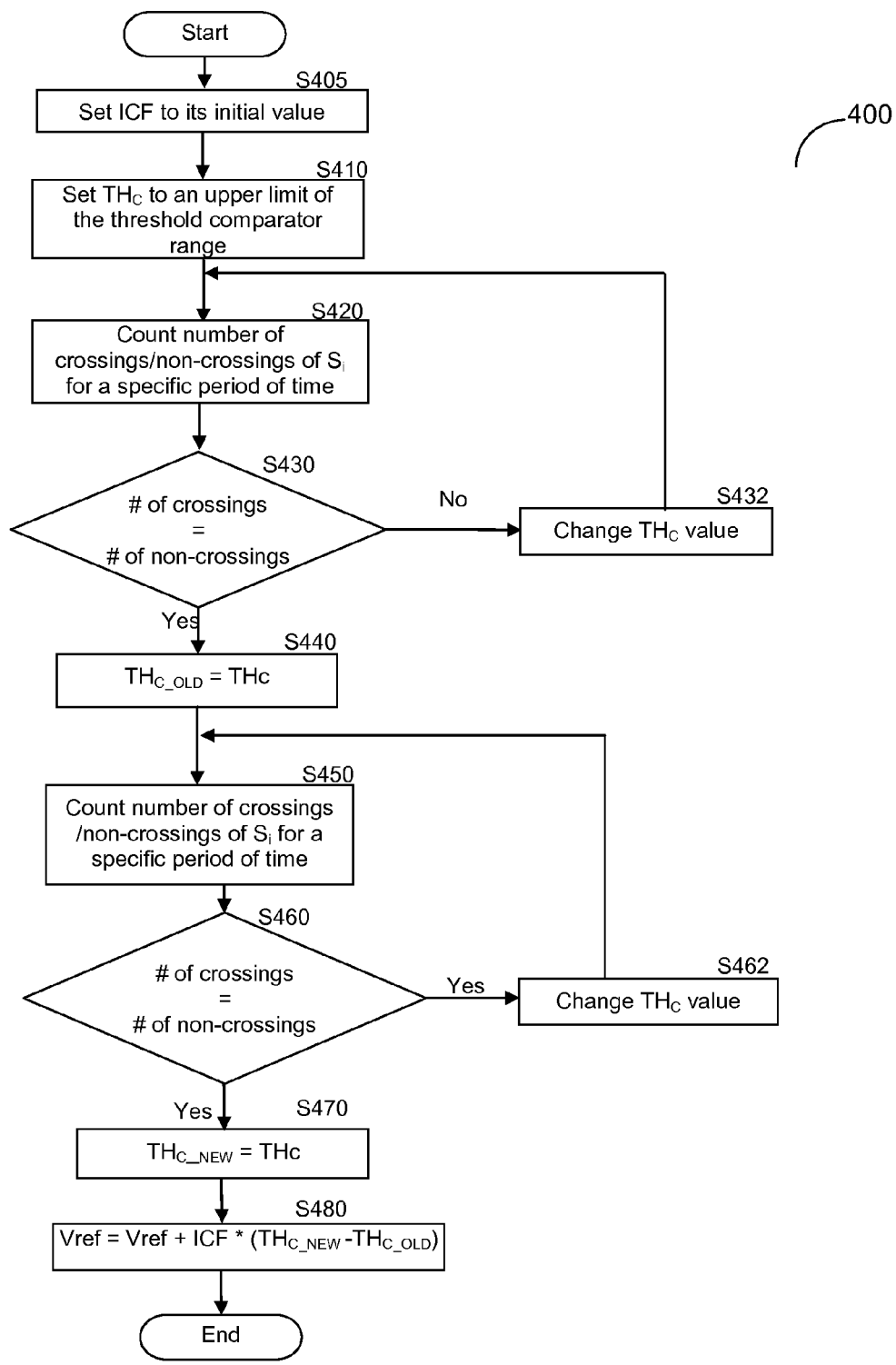
FIG. 4 is a flowchart illustrating a compensation process performed using a fixed compensation ratio according to one embodiment.

FIG. 4 shows an exemplary and non-limiting flowchart 400 illustrating one of the compensation processes performed by the controller 352 according to an embodiment of the invention. For the sake of brevity and without limiting the scope of the invention, the process 400 will be described with a reference to a particular embodiment where the receiver 200 is a PAM-4 receiver, thus the interface unit 230, and hence the controller 352 are capable of processing PAM-4 signals. However, it should be noted that one of ordinary skill can adapt the teachings described herein to implement a compensation solution for higher level PAM signals.

The controller 352 continuously tracks gain variations in the equalized signal 302 using the comparator 340 and changes the thresholds of the comparators 311 and 313 (high and low PAM-4 level comparators, accordingly). Specifically, after an initialization phase, the comparator 340 is set to detect crossings around one of the PAM-4 level, $S_i$ {i=0, 1, 2, or 3} by setting the threshold $TH_C$ to a respective value of the selected level $S_i$. That is, the value of the $TH_C$ is set so the number of readings of crossings and non-crossings of the level $S_i$ will be equal over a predefined period of time.

At S405, an initial compensation factor (ICF) is set. In one embodiment, the ICF is set the ratio of Vref and $TH_C$, i.e., Vref/$TH_C$. In another embodiment, the ICF is set to a predefined value.

At S410, the compensation comparator 340 threshold $TH_C$ is set to an initial value. In one embodiment, the $TH_C$ is set to the upper limit of the threshold level that the comparator 340 supports. At S420, the compensation comparator 340 detects crossings around one of the PAM-4 levels, $S_i$ {i=0, 1, 2, or 3}. For example, $S_i=S_0$ which is +3 v PAM-4 level. This includes adjusting the $TH_C$ value until the number of crossings and non-crossings of the level $S_i$, during a predefined period of time, will be equal over (S430, S432). That is, 50% of the predefined period of time the comparator 340 results in '0' and 50% of the time results '1'. At S440, the value of $TH_C$ that achieves this condition is saved as $TH_{C\_OLD}$.

At S450, the compensation comparator 340 is set to detect crossings around the same PAM-4 level, $S_i$ {i=0, 1, 2, or 3} as performed at S420. This includes adjusting the THc value, currently set to $TH_C$, until the number of crossings and non-crossings of the level $S_i$ is equal, during a predefined period of time (S460, S462). At S470, the value of $TH_C$ that achieves this condition is saved as $TH_{C\_NEW}$. At S480, Vref as the value for setting the comparators 311 and 313 is set to be Vref+ICF*($TH_{C\_NEW}-TH_{C\_OLD}$).

In one embodiment, the process 400 may be also performed for $S_i=S_3$ (i.e., a−3 v PAM-4 level) for setting the threshold of the comparator 313 separately from the comparator 311.

Once the Vref value is updated, the process 400 is repeated as long as the electronic device operates. Specifically, in the steady state operation of the device, the $TH_C$ is continuously tracked and changed to allow zero accumulation of crossings/non-crossings. With this aim, once the Vref is set at S480, execution continues with S440 to perform steps S450 through S480. It should be noted that steps S410 through S440 are typically performed immediately after the device is powered up to set $TH_C$ to its initial value.

Following is a non-limiting example for the operation of the compensation process 400. The threshold levels of the comparators 340, 311, 312, and 313 are initially set to +3 v; CM+2 v; CM; and CM−2 v, respectively. Thus, $TH_C$=+3 v, Vref=2 v and ICF is ⅔. It should be noted that the value may not necessarily be an exact ratio between Vref and THc. After some time, the cable's temperature is increased, hence the attenuation of the cable is increased. As a result, the voltage level of the equalized signal decreases.

Due to a lower value of the equalized signal, the $TH_C$ value of the comparator 340 is decreased, for example, from +3 v to +2.7 v. The new $TH_C$ ensures a zero accumulated value at the comparator 340. The difference Δ ($TH_{C\_NEW}-TH_{C\_OLD}$=−0.3 v) in the $TH_C$ value is translated into a change of −0.2 v (=Δ*ICF) decrease in the Vref. Thus, the new Vref value will be equal to 1.8 v. By changing the threshold levels, the crossing points of the comparators 311 and 313 are changed to compensate for the new signal level affected by the temperature.

Figure 5:
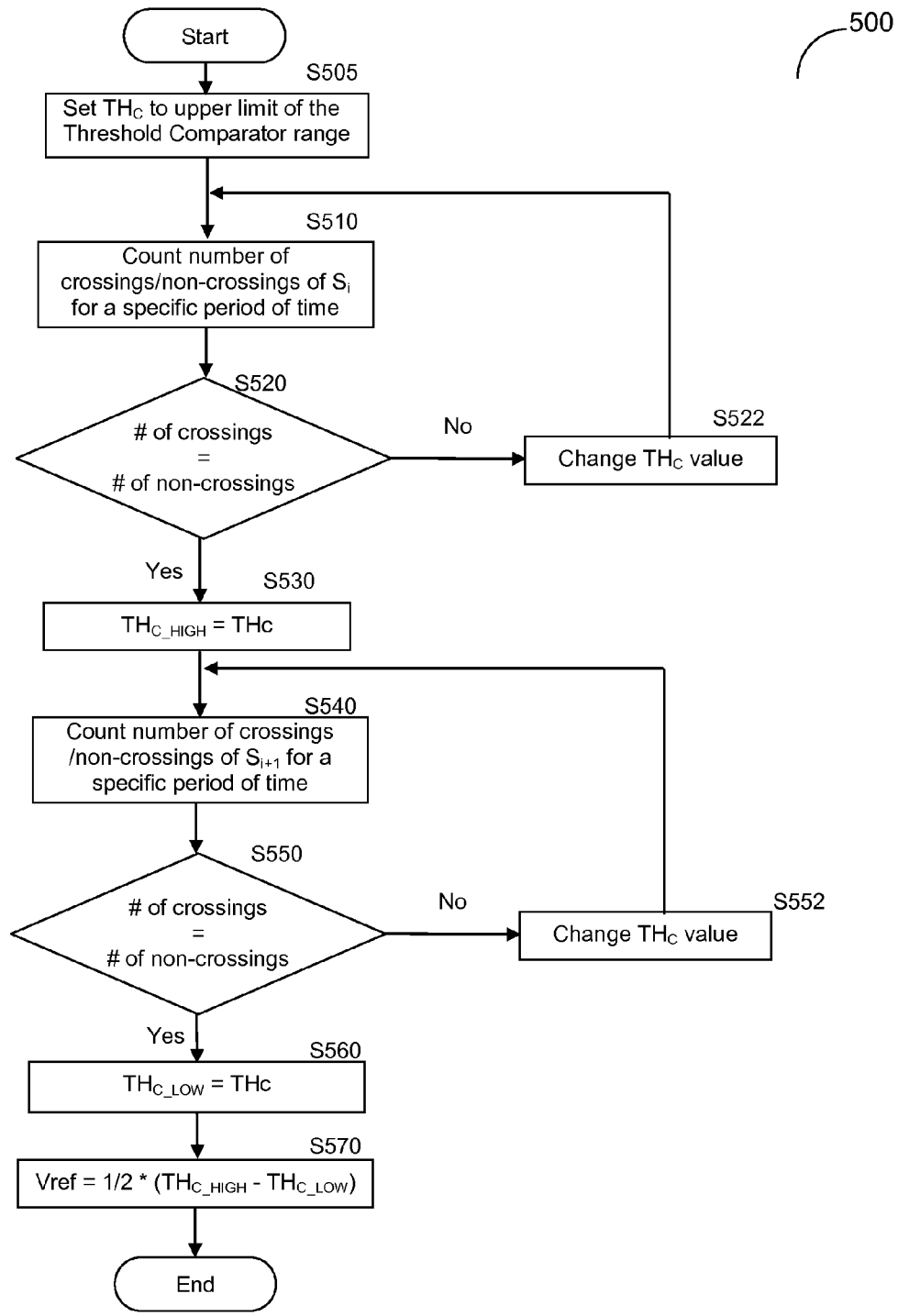
FIG. 5 is a flowchart illustrating a compensation process that dynamically adjusts the comparators' thresholds according to another embodiment.

FIG. 5 shows an exemplary flowchart 500 illustrating another embodiment of the compensation processer performed by the controller 352. For the sake of brevity and without limiting the scope of the invention, the process 500 will be described with a reference to a particular embodiment where the receiver 200 is a PAM-4 receiver, thus the interface unit 230 and the controller 352 are capable of processing PAM-4 signals. However, it should be noted that one of ordinary skill can adapt the teachings described herein to implement a compensation solution for higher level PAM signals.

The process 500 dynamically adjusts the Vref values of the comparators 311 and 313 by tracking gain changes in the equalized signal around two different PAM-4 levels $S_i$ and $S_{i+1}$ {i=0, 1, 2, or 3}. Thus, in contrast to the process 400, here the compensation is not based on a fixed ratio (i.e., the ICF). The process 500 starts once the initialization phase of the electronic device is completed.

At S505, the compensation comparator 340 threshold ($TH_C$) is set to an initial value. In one embodiment, the initial value is the upper limit of the threshold level that the comparator 340 can support, i.e., the upper limit of its dynamic range. Then, at S510, the compensation comparator 340 detects crossings around one of the PAM-4 level, $S_i$ {i=0, 1, 2, or 3}. For example, $S_i=S_0$ which is +3 v PAM-4 level. This includes adjusting the $TH_C$ value until the number of crossings and non-crossings of the level $S_i$, during a predefined period of time, will be equal over (S520, S522). That is, 50% of the predefined period of time the comparator 340 results in '0' and 50% of the time results '1'. At S530, the value of $TH_C$ that achieves this condition is saved as $TH_{C\_HIGH}$.

At S540, the compensation comparator 340 is set to detect crossings around another PAM-4 level, $S_{i+1}$ {i=0, 1, 2, or 3}. For example, $S_i=S_1$ which is +1 v PAM-4 level. This includes adjusting the $TH_C$ value until the number of crossings and non-crossings of the level $S_{i+1}$ is equal along a predefined period of time (S550, S552). At S560, the value of $TH_C$ that achieves this condition is saved as $TH_{C\_LOW}$. At S570, Vref value of the comparators 311 and 313 is set to be the average of $TH_{C\_HIGH}$ and $TH_{C\_LOW}$. That is, Vref=($TH_{C\_HIGH}$+ $TH_{C\_LOW}$)/2.

In one embodiment, the process 500 may be also performed for $S_i=S_2$ and $S_{i+1}=S_3$ to adjust the threshold value of the comparator 313 separately from the comparator 311. Once the Vref is updated, the process 500 is repeated as long as the electronic device operates.

As a non-limiting example to the operation of the process 500, assuming that the check is performed around the PAM-4 level $S_3$=+3 v; and $S_1$=+1 v, and the respective measure $TH_{C\_HIGH}$ and $TH_{C\_LOW}$ values are +2.9 v and +0.9 v, then Vref is set to +1.9 v.

Figure 6:
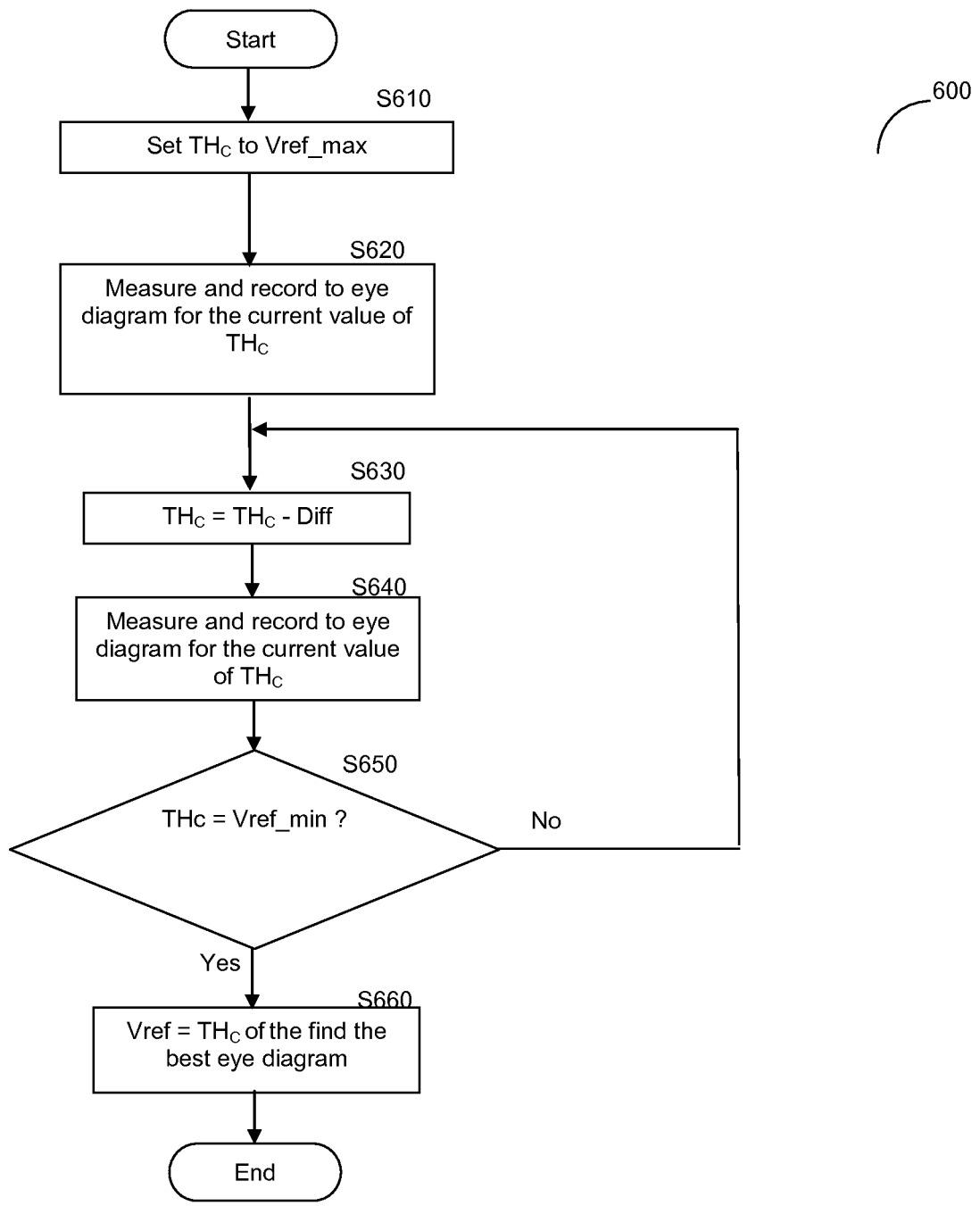
FIG. 6 is a flowchart illustrating a compensation process where the comparators' thresholds are set based on an eye diagram according to another embodiment.

In another embodiment, the controller 352 performs an adaptive compensation process that changes the Vref based on the "eye diagram" of the sampled data. The process 600 starts once the initialization phase of the electronic device is completed. This process is illustrated in FIG. 6.

At S610, the threshold ($TH_C$) of the comparator 340 is set to the upper limit of threshold level (Vref_max) of one of the threshold levels of the comparators 311, 312, or 313. For example, $TH_C$ may be set to +2 v which is the Vref of the comparator 311. At S620, an eye diagram is generated and recorded. At S630, the $TH_C$ value of the comparator 340 is iteratively changed, each iteration by a predefined value, between high and low boundaries of the Vref (Vref_max and Vref_min). For example, if the $TH_C$ is set initially to Vref_max=+2V, the test will be performed for values between +2.5 v which is the upper limit and +1.5 v which is the lower limit at intervals of 0.1 v at each iteration. At S640, in each iteration, an eye diagram is generated and recorded.

At S660, the Vref that results in the most open eye diagram (widest eye) is selected as the value for setting the comparators 311 and 313.

The process with comparator 340 may be also performed by initially setting $TH_C$ to −Vref_max (e.g., −2 v) to adjust the threshold level of the comparator 313 separately from the comparator 311. Once the Vref is updated, the process 600 is repeated as long as the electronic device operates.

In one embodiment, an eye diagram is generated by sampling the data at the output of the interface unit 230 using 'p' shifted versions of the recovered clock (p is an integer number greater than 1); each clock is shifted by 2*Pi/p. Then, a histogram is created using the number of changes at each clock sampling point. An open eye diagram is represented by a low number of changes in the center of the histogram. Other techniques for generating eye diagrams will be apparent to one of ordinary skill in the art.

All the embodiments described above are for compensating for changes in the equalizer gain due to temperature changes. Once the temperature is changed, the crossings/non-crossings will be different from 50%. This causes a change in the threshold of the comparator 340, hence the threshold values of the comparators 311 and 313 will be adjusted to compensate for the gain variations.

The various embodiments discussed herein may be implemented as any combination of hardware, firmware, and software. Moreover, the software is preferably implemented as an application program tangibly embodied on a program storage unit or computer readable medium. One of ordinary skill in the art would recognize that a "machine readable medium" or computer readable medium is a non-transitory medium capable of storing data and can be in a form of a digital circuit, an analogy circuit, a magnetic media or combination thereof. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit.

The foregoing detailed description has set forth a few of the many forms that the invention can take. It is intended that the foregoing detailed description be understood as an illustration of selected forms that the invention can take and not as a limitation to the definition of the invention.

What is claimed is:

1. An interface circuit for compensating for gain changes of an N-level pulse amplitude modulation (PAM-N) modulated signal, N being an integer, comprising:
   a number of N−1 comparators for comparing the PAM-N modulated signal to N−1 configurable thresholds, wherein the PAM-N modulated signal was also equalized and the N−1 configurable thresholds are N−1 different voltage levels;
   a compensation comparator for tracking gain changes in the input PAM-N modulated signal by comparing the input PAM-N modulated signal to a compensation threshold; and
   a compensation circuit for changing at least one of the N−1 configurable thresholds of the N−1 comparators based on an output of the compensation comparator, thereby offsetting a crossing point of at least one comparator of the N−1 comparators respective of the at least one of the N−1 configurable thresholds to compensate for gain changes in the input PAM-N modulated signal, wherein the compensation circuit further comprises:
       an accumulator for accumulating a number of crossings and non-crossings of the compensation threshold over time as output by the compensation comparator;
       a controller for performing at least a process for changing the at least one of the N−1 configurable thresholds of the N−1 comparators based on the output of the compensation comparator; and a voltage setting unit for setting the compensation comparator and the at least one of the N−1 configurable thresholds based on a control signal generated by the controller, wherein the controller, when performing the at least process, is configured to:
repetitively change the at least one of the N−1 configurable thresholds of the N−1 comparators based on crossings of a single PAM-N level of the compensation threshold and a fixed factor; and wherein the at least process further comprises:
set an initial compensation factor (ICF);
set the compensation threshold to an initial value;
detect, by the compensation comparator, crossings around a first PAM-N level out of N PAM-N modulation levels;
iteratively change a voltage level of the compensation threshold until an accumulated number of crossings and non-crossings of the compensation threshold respective of the first PAM-N level over time is equal;
save a voltage level of the compensation threshold that achieves an equal accumulated number of crossings and non-crossings as a current compensation threshold value; and
set the at least one of the N−1 configurable thresholds to a difference of the current compensation threshold and a previous value of the compensation threshold, multiplied by the ICF.

2. The interface circuit of claim 1, wherein the initial compensation factor is set to a ratio of the at least one N−1 configurable threshold and the compensation factor and the compensation threshold initial value is set to a value respective of the first PAM-N level.

3. An interface circuit for compensating for gain changes of an N-level pulse amplitude modulation (PAM-N) modulated signal, N being an integer, comprising:
a number of N−1 comparators for comparing the PAM-N modulated signal to N−1 configurable thresholds, wherein the PAM-N modulated signal was also equalized and the N−1 configurable thresholds are N−1 different voltage levels;
a compensation comparator for tracking gain changes in the input PAM-N modulated signal by comparing the input PAM-N modulated signal to a compensation threshold; and
a compensation circuit for changing at least one of the N−1 configurable thresholds of the N−1 comparators based on an output of the compensation comparator, thereby offsetting a crossing point of at least one comparator of the N−1 comparators respective of the at least one of the N−1 configurable thresholds to compensate for gain changes in the input PAM-N modulated signal, wherein the compensation circuit further comprises:
an accumulator for accumulating a number of crossings and non-crossings of the compensation threshold over time as output by the compensation comparator;
a controller for performing at least a process for changing the at least one of the N−1 configurable thresholds of the N−1 comparators based on the output of the compensation comparator; and
a voltage setting unit for setting the compensation comparator and the at least one of the N−1 configurable thresholds based on a control signal generated by the controller, wherein the controller, when performing the at least process, is configured to:
repetitively change the at least one of the N−1 configurable thresholds of the N−1 comparators based on crossings of at least two PAM-N levels of the compensation threshold;
detect by the compensation comparator, crossings around a first PAM-N level out of N PAM-N modulation levels;
iteratively change a voltage level of the compensation threshold until an accumulated number of crossings and non-crossings of the compensation threshold respective of the first PAM-N level over time is equal;
save a voltage level of the compensation threshold that achieves an equal accumulated number of crossings and non-crossings as a high compensation threshold value;
detect by the compensation comparator, crossings around a second PAM-N level out of the N PAM-N modulation levels;
iteratively change a voltage level of the compensation threshold until an accumulated number of crossings and non-crossings of the compensation threshold respective of the second PAM-N level over time is equal;
save a voltage level of the compensation threshold that achieves an equal accumulated number of crossings and non-crossings as a low compensation threshold value; and
set the least one of the N−1 configurable thresholds to an average value of the high compensation threshold and the low compensation threshold.

4. The interface circuit of claim 3, wherein the second PAM-N level is next to the first PAM-N level, wherein the least one of the N−1 configurable thresholds is used by at least one of the N−1 comparators being set to detect crossings between the second and the first PAM-N levels.

5. An interface circuit for compensating for gain changes of an N-level pulse amplitude modulation (PAM-N) modulated signal, N being an integer, comprising:
a number of N−1 comparators for comparing the PAM-N modulated signal to N−1 configurable thresholds, wherein the PAM-N modulated signal was also equalized and the N−1 configurable thresholds are N−1 different voltage levels;
a compensation comparator for tracking gain changes in the input PAM-N modulated signal by comparing the input PAM-N modulated signal to a compensation threshold; and
a compensation circuit for changing at least one of the N−1 configurable thresholds of the N−1 comparators based on an output of the compensation comparator, thereby offsetting a crossing point of at least one comparator of the N−1 comparators respective of the at least one of the N−1 configurable thresholds to compensate for gain changes in the input PAM-N modulated signal, wherein the compensation circuit further comprises:
an accumulator for accumulating a number of crossings and non-crossings of the compensation threshold over time as output by the compensation comparator;
a controller for performing at least a process for changing the at least one of the N−1 configurable thresholds of the N−1 comparators based on the output of the compensation comparator; and
a voltage setting unit for setting the compensation comparator and the at least one of the N−1 configurable thresholds based on a control signal generated by the controller, wherein the controller, when performing the at least process, is configured to:
repetitively change the at least one of the N−1 configurable thresholds of the N−1 comparators based on an eye diagram of a recorded and sampled input PAM-N modulated signal;
set the compensation threshold to an initial value, wherein the initial value is an upper limit of a maximum level of the N−1 configurable thresholds;
iteratively change a voltage level of the compensation threshold from the initial value to a lower limit of maximum level of the N−1 configurable thresholds and generating an eye diagram, at each iteration the compensation threshold is changed by a predefined voltage interval and a respective generated eye diagram is saved together with a current level of the compensation threshold;
select an eye diagram with a widest eye; and
set the at least one of the N−1 configurable thresholds to a voltage level of a compensation threshold associated with the eye diagram with the widest eye.

6. The interface circuit of claim 5, wherein the at least one of the N−1 configurable thresholds includes at least a threshold value of a comparator that detects a +3 volts PAM-4 level crossing and at least a threshold value of a comparator that detects a +1 volt PAM-4 level crossing.

7. A method for compensating for gain changes of an N-level pulse amplitude modulation (PAM-N) modulated signal, N being an integer, comprising:
comparing the PAM-N modulated signal to N−1 configurable thresholds, wherein the PAM-N modulated signal was also equalized and the N−1 configurable thresholds are N−1 different voltage levels;
tracking gain changes in the PAM-N modulated signal by comparing the PAM-N modulated signal to a compensation threshold;
adjusting a level of the at least one of the N−1 configurable thresholds of N−1 comparators based on an output of a compensation comparator, thereby offsetting a crossing point of at least one comparator respective of the at least one of the N−1 configurable thresholds to compensate for gain changes in the PAM-N modulated signal;
accumulating a number of crossings and non-crossings of the compensation threshold over time as output by the compensation comparator;
performing at least a process for changing the at least one of the N−1 configurable thresholds of the N−1 comparators based on the output of the compensation comparator; and
setting the compensation comparator and the at least one of the N−1 configurable thresholds based on a control signal generated by the controller, wherein the at least process includes repetitively changing the at least one of the N−1 configurable thresholds of the N−1 comparators based on crossings of a single PAM-N level of the compensation threshold and a fixed factor, and wherein the at least process further comprises:
setting an initial compensation factor (ICF);
setting the compensation threshold to an initial value, wherein the initial value is set to a value respective of the first PAM-N level;
detecting, by the compensation comparator, crossings around a first PAM-N level out of N PAM-N modulation levels;
iteratively changing a voltage level of the compensation threshold until an accumulated number of crossings and non-crossings of the compensation threshold respective of the first PAM-N level over time is equal;
saving a voltage level of the compensation threshold that achieves an equal accumulated number of crossings and non-crossings as a current compensation threshold value; and
setting the least one of the N−1 configurable thresholds to a difference of the current compensation threshold and a previous first compensation threshold multiplied by the ICF.

8. A method for compensating for gain changes of an N-level pulse amplitude modulation (PAM-N) modulated signal, N being an integer, comprising:
comparing the PAM-N modulated signal to N−1 configurable thresholds, wherein the PAM-N modulated signal was also equalized and the N−1 configurable thresholds are N−1 different voltage levels;
tracking gain changes in the PAM-N modulated signal by comparing the PAM-N modulated signal to a compensation threshold;
adjusting a level of the at least one of the N−1 configurable thresholds of N−1 comparators based on an output of a compensation comparator, thereby offsetting a crossing point of at least one comparator respective of the at least one of the N−1 configurable thresholds to compensate for gain changes in the PAM-N modulated signal;
accumulating a number of crossings and non-crossings of the compensation threshold over time as output by the compensation comparator;
performing at least a process for changing the at least one of the N−1 configurable thresholds of the N−1 comparators based on the output of the compensation comparator; and
setting the compensation comparator and the at least one of the N−1 configurable thresholds based on a control signal generated by the controller, wherein the at least process further comprises:
detecting by the compensation comparator crossings around a first PAM-N level out of N PAM-N modulation levels;
iteratively changing a voltage level of the compensation threshold until an accumulated number of crossings and non-crossings of the compensation threshold respective of the first PAM-N level over time is equal;
saving a voltage level of the compensation threshold that achieves an equal accumulated number of crossings and non-crossings as a high compensation threshold value;
detecting by the compensation comparator, crossings around a second PAM-N level out of N PAM-N modulation levels, wherein the second PAM-N level is next to the first PAM-N level;
iteratively changing a voltage level of the compensation threshold until an accumulated number of crossings and non-crossings of the compensation threshold respective of the second PAM-N level over time is equal;
saving a voltage level of the compensation threshold that achieves an equal accumulated number of crossings and non-crossings as a low compensation threshold value; and
setting the least one of the N−1 configurable thresholds to an average value of the high compensation threshold and the low compensation threshold.

9. A method for compensating for gain changes of an N-level pulse amplitude modulation (PAM-N) modulated signal, N being an integer, comprising:

comparing the PAM-N modulated signal to N−1 configurable thresholds, wherein the PAM-N modulated signal was also equalized and the N−1 configurable thresholds are N−1 different voltage levels;

tracking gain changes in the PAM-N modulated signal by comparing the PAM-N modulated signal to a compensation threshold;

adjusting a level of the at least one of the N−1 configurable thresholds of N−1 comparators based on an output of a compensation comparator, thereby offsetting a crossing point of at least one comparator respective of the at least one of the N−1 configurable thresholds to compensate for gain changes in the PAM-N modulated signal;

accumulating a number of crossings and non-crossings of the compensation threshold over time as output by the compensation comparator;

performing at least a process for changing the at least one of the N−1 configurable thresholds of the N−1 comparators based on the output of the compensation comparator;

setting the compensation comparator and the at least one of the N−1 configurable thresholds based on a control signal generated by the controller, wherein the at least process includes repetitively changing the at least one of the N−1 configurable thresholds of the N−1 comparators based on an eye diagram of a recorded and sampled input PAM-N modulated signal, and wherein the at least process further comprises:

setting the compensation threshold to an initial value, wherein the initial value is an upper limit of a maximum level of the N−1 configurable thresholds;

iteratively changing a voltage level of the compensation threshold from the initial value to a lower limit of maximum level of the N−1 configurable thresholds and generating an eye diagram; at each iteration the compensation threshold is changed by a predefined voltage interval and a respective generated eye diagram is saved together with a current level of the compensation threshold;

selecting an eye diagram with a widest eye; and setting the at least one of the N−1 configurable thresholds to a voltage level of a compensation threshold associated with the eye diagram with the widest eye.

10. The method of claim 7, wherein the at least one of the N−1 configurable thresholds includes at least a threshold value of a comparator that detects a +3 volts PAM-4 level crossing and at least a threshold value of a comparator that detects a +1 volt PAM-4 level crossing.

11. A method for compensating for gain changes of a 4-level pulse amplitude modulation (PAM-4) modulated signal, N being an integer, comprising:

comparing the PAM-4 modulated signal to three configurable thresholds, wherein the PAM-4 modulated signal was also equalized and the three configurable thresholds are three different voltage levels;

tracking gain changes in the PAM-4 modulated signal by comparing the PAM-4 modulated signal to a compensation threshold; and adjusting a level of at least one of the three configurable thresholds of three comparators based on an output of a compensation comparator, thereby offsetting a crossing point of at least one comparator of the three comparators respective of the at least one of the three configurable thresholds to compensate for gain changes in the PAM-4 modulated signal, wherein the at least process further comprises:

detecting by the compensation comparator crossings around a +3 volts PAM-4 level by a first comparator;

iteratively changing a voltage level of the compensation threshold until an accumulated number of crossings and non-crossings of the compensation threshold respective of the +3 volts PAM-4 level over time is equal;

saving a voltage level of the compensation threshold that achieves an equal accumulated number of crossings and non-crossings as a high compensation threshold value;

detecting by the compensation comparator, crossings around a +1 volt PAM-4 level by a second comparator;

iteratively changing a voltage level of the compensation threshold until an accumulated number of crossings and non-crossings of the compensation threshold respective of the +1 volt PAM-4 level over time is equal;

saving a voltage level of the compensation threshold that achieves an equal accumulated number of crossings and non-crossings as a low compensation threshold value; and setting a reference level respective of configurable thresholds of the first comparator and the second comparator to an average value of the high compensation threshold and the low compensation threshold.

* * * * *